(12) United States Patent
Lee et al.

(10) Patent No.: US 9,689,953 B2
(45) Date of Patent: Jun. 27, 2017

(54) MRI SYSTEM AND METHOD OF DIAGNOSING THE SAME

(71) Applicant: Samsung Electronics Co., Ltd., Gyeonggi-do (KR)

(72) Inventors: Man-woo Lee, Gyeonggi-do (KR); Joon-soo Kim, Seoul (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 1088 days.

(21) Appl. No.: 13/887,717

(22) Filed: May 6, 2013

(65) Prior Publication Data

US 2014/0145719 A1    May 29, 2014

(30) Foreign Application Priority Data

Nov. 26, 2012  (KR) .......................... 10-2012-0134867

(51) Int. Cl.
  *G01R 33/58*   (2006.01)
  *G01R 33/565*  (2006.01)

(52) U.S. Cl.
  CPC ..... *G01R 33/56572* (2013.01); *G01R 33/565* (2013.01); *G01R 33/58* (2013.01); *G01R 33/56518* (2013.01)

(58) Field of Classification Search
  CPC  G01R 33/58; G01R 33/565; G01R 33/56518; G01R 33/56572
  See application file for complete search history.

(56) References Cited

U.S. PATENT DOCUMENTS

| | | | | |
|---|---|---|---|---|
| 4,893,081 A | | 1/1990 | Zur | |
| 4,950,994 A | * | 8/1990 | Glover | G01R 33/3875 324/318 |
| 4,973,906 A | * | 11/1990 | Bernstein | G01R 33/561 324/306 |
| 5,410,249 A | * | 4/1995 | Van Yperen | G01R 33/5615 324/307 |
| 5,647,362 A | * | 7/1997 | Fuderer | G01R 33/56554 324/309 |

(Continued)

FOREIGN PATENT DOCUMENTS

| | | |
|---|---|---|
| CN | 102508182 A | 6/2012 |
| EP | 1 004 892 A1 | 11/1999 |

(Continued)

*Primary Examiner* — Dixomara Vargas
(74) *Attorney, Agent, or Firm* — Cha & Reiter, LLC (57) ABSTRACT

A method of diagnosing a magnetic resonance imaging (MRI) system includes forming a gradient magnetic field in a scanning space where a target object is positioned by generating a plurality of modified gradient pulses based on a reference gradient pulse and applying one of the plurality of modified gradient pulses to one of an x-axis coil, a y-axis coil, and a z-axis coil included in a gradient coil, applying a radio frequency (RF) pulse from an RF coil to the target object in the scanning space where the gradient magnetic field corresponding to each of the plurality of modified gradient pulses is formed, receiving a plurality of RF signals that are generated from the target object and correspond to the plurality of modified gradient pulses, and compensating an output of the gradient coil based on the plurality of received RF signals.

23 Claims, 7 Drawing Sheets

(56) References Cited

U.S. PATENT DOCUMENTS

| | | | |
|---|---|---|---|
| 6,008,647 A * | 12/1999 | Zhou | G01R 33/56581 324/306 |
| 6,011,392 A * | 1/2000 | Zhou | G01R 33/56554 324/307 |
| 6,043,656 A * | 3/2000 | Ma | G01R 33/56518 324/309 |
| 6,288,545 B1 | 9/2001 | King et al. | |
| 6,335,621 B1 | 1/2002 | Cho | |
| 6,362,621 B1 | 3/2002 | Miyamoto et al. | |
| 6,470,203 B2 | 10/2002 | Miyamoto | |
| 6,522,137 B1 * | 2/2003 | Sun | G01V 3/32 324/303 |
| 7,027,853 B2 * | 4/2006 | Ma | G01R 33/4828 128/897 |
| 7,081,750 B1 | 7/2006 | Zhang | |
| 7,218,110 B2 * | 5/2007 | Zhang | G01R 33/56341 324/307 |
| 7,942,155 B2 | 5/2011 | Van Iderstine | |
| 8,094,909 B2 | 1/2012 | Maier et al. | |
| 8,624,595 B2 | 1/2014 | Umeda | |
| 8,791,695 B2 * | 7/2014 | Balcom | G01R 33/305 324/303 |
| 2004/0064032 A1 | 4/2004 | Ma | |
| 2007/0052417 A1 | 3/2007 | Zhang et al. | |

FOREIGN PATENT DOCUMENTS

| | | |
|---|---|---|
| JP | 2012-5823 A | 1/2012 |
| JP | 2012-223469 A | 11/2012 |
| KR | 2002-0026425 A | 4/2002 |
| KR | 10-2011-0075859 A | 7/2011 |

* cited by examiner

MRI SYSTEM AND METHOD OF DIAGNOSING THE SAME

CLAIM OF PRIORITY

This application claims, pursuant to 35 U.S.C. 119(a), prior to and the benefit of the earlier filing date of Korean Patent Application No. 10-2012-0134867, filed on Nov. 26, 2012, in the Korean Intellectual Property Office, the disclosure of which is incorporated herein in its entirety by reference.

BACKGROUND OF THE INVENTION

1. Field of the Invention

The present invention relates to a magnetic resonance imaging (MRI) system and, in particular, to a method of diagnosing the MRI system.

2. Description of the Related Art

A magnetic resonance imaging (MRI) system generates an image by using information obtained from resonance that occurs after exposing an atomic nucleus to a magnetic field. The resonance of an atomic nucleus refers to a phenomenon whereby, when a particular high frequency wave is incident on an atomic nucleus in a state of being magnetized by an external magnetic field, the atomic nucleus in a low energy state absorbs a high frequency wave energy and thus, is excited to a high energy state. The atomic nucleus has a resonant frequency that differs according to the type of atomic nucleus. The resonance is affected by the strength of an external magnetic field. There are numerous atomic nuclei in a human body and a hydrogen atomic nucleus is generally used for MRI.

An MRI system includes a magnet for forming a main magnetic field in a scanning space, a radio frequency (RF) coil for generating an RF signal in the scanning space, and a gradient coil for forming a gradient magnetic field to select a scanning area of a target object in the scanning space. In the MRI system, a pulse sequence designed for scanning a target object is applied to the RF coil and the gradient coil, and an echo signal of the RF signal generated from the scanning space is obtained. The signals output by the RF coil and the gradient coil have errors due to many factors. The errors in an output signal deteriorate a signal to noise ratio (SNR) of an MR image. Also, an MR image may include artifacts.

SUMMARY OF THE INVENTION

The present invention provides a magnetic resonance imaging (MRI) system that may simply and accurately measure an error of a gradient coil and compensate an output thereof, and a method of diagnosing the MRI system.

According to an aspect of the present invention, a method of diagnosing a magnetic resonance imaging (MRI) system includes forming a gradient magnetic field in a scanning space where a target object is positioned by generating a plurality of modified gradient pulses based on a reference gradient pulse and applying one of the plurality of modified gradient pulses to one of an x-axis coil, a y-axis coil, and a z-axis coil included in a gradient coil, applying a radio frequency (RF) pulse from an RF coil to the target object in the scanning space where the gradient magnetic field corresponding to each of the plurality of modified gradient pulses is formed, and receiving a plurality of RF signals that are generated from the target object and correspond to the plurality of modified gradient pulses, and compensating an output of the gradient coil based on the plurality of received RF signals.

The compensating of the output may include determining a tuning value with respect to the reference gradient pulse by considering the plurality of received RF signals, and adjusting a pulse sequence applied to the gradient coil based on the tuning value. The compensating of the output may include selecting an optimal modified gradient pulse for optimizing the RF signal based on the plurality of received RF signals and adjusting a pulse sequence applied to the gradient coil based on a difference between the optimal modified gradient pulse and the reference gradient pulse. The pulse sequence may include at least one of a spin echo sequence, a turbo spin echo sequence, an inversion recovery sequence, a gradient echo sequence, and a field echo sequence.

The forming of the gradient magnetic field may include generating the plurality of modified gradient pulses by modifying at least one of the height, width, and phase of the reference gradient pulse. In the compensating of the output, the output of the gradient coil may be compensated based on a difference between the reference gradient pulse and a modified gradient pulse corresponding to one of the plurality of received RF signals that has the largest amplitude.

The reference gradient pulse may include a first pulse having a positive (+) value and a second pulse having a negative (−) value and the first and second pulses have the same amplitude. The RF signal may include a pulse having a phase of 90° and a pulse having a phase of 180°, and the reference gradient pulse comprises a first pulse having a phase that is earlier than 180° and a second pulse having a phase that is later than 180°, with the first and second pulses having the same amplitude.

The method may further include determining whether the MRI system is stable by using the reference gradient pulse, wherein only when the MRI system is determined to be stable is the forming of the gradient magnetic field, the receiving of the plurality of RF signals, and the compensating of the output of the gradient coil performed. The determining of whether the MRI system is stable may include forming a gradient magnetic field in the scanning space by applying the reference gradient pulse to at least one of the x-axis coil, the y-axis coil, and the z-axis coil, repeating multiple times applying of an RF pulse from the RF coil to the target object in the scanning space where the gradient magnetic field is formed and receiving of an RF signal generated from the target object in the scanning space where the gradient magnetic field is formed, the RF signal being received by a receiving coil, and determining that the MRI system is stable when a change in at least one of an amplitude and a phase of the received RF signals is within a predetermined range.

The method may further include remotely receiving a user input, and performing the MRI system diagnosis method based on the user input.

According to another aspect of the present invention, a method of diagnosing a magnetic resonance imaging (MRI) system includes forming a gradient magnetic field in a scanning space where a target object is positioned by applying a predetermined reference gradient pulse to at least one of an x-axis coil, a y-axis coil, and a z-axis coil included in a gradient coil, repeating multiple times applying of an RF pulse from the RF coil to the target object in the scanning space where the gradient magnetic field is formed and receiving of an RF signal generated from the target object, the RF signal being received by a receiving coil, and determining whether the MRI system is stable based on a change in at least one of an amplitude and a phase of the received RF signals.

According to another aspect of the present invention, a magnetic resonance imaging (MRI) system includes a magnet for forming a main magnetic field in a scanning space where a target object is positioned, a radio frequency (RF) coil for generating an RF signal in the scanning space, a gradient coil driving unit for forming a gradient magnetic field in the scanning space by applying one of a plurality of modified gradient pulses generated based on a predetermined reference gradient pulse to one of an x-axis coil, a y-axis coil, and a z-axis coil included in a gradient coil, a receiving coil for receiving a plurality of RF signals that are generated from the target object in the scanning space where a gradient magnetic field is formed and corresponds to the plurality of modified gradient pulses, and a control unit for controlling the magnet, the RF coil, the gradient coil, the gradient coil driving unit, and the receiving coil, wherein the control unit compensates an output of the gradient coil based on the plurality of received RF signals.

According to another aspect of the present invention, a magnetic resonance imaging (MRI) system includes a magnet for forming a main magnetic field in a scanning space where a target object is positioned, a radio frequency (RF) coil for generating an RF pulse in the scanning space, a gradient coil driving unit for forming a gradient magnetic field in the scanning space by applying a predetermined gradient pulse to at least one of an x-axis coil, a y-axis coil, and a z-axis coil included in a gradient coil, a receiving coil repeatedly for receiving multiple times an RF signal that is generated from the target object in the scanning space where a gradient magnetic field is formed, a stability check unit for determining whether the MRI system is stable based on a change in at least one of an amplitude and a phase of each of the received RF signals, and a control unit for controlling the magnet, the RF coil, the gradient coil, the receiving coil, the gradient coil driving unit, and the stability check unit.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by illustrating exemplary embodiments of the invention with reference to the attached drawings. Like reference numerals in the drawings refer to like elements. The present invention may, however, be embodied in many different forms and should not be construed as limited to the exemplary embodiments set forth herein. In addition, terms described herein, which are defined with reference to the functions of the present invention, may be implemented differently depending on a user or operator's intention and practice. Therefore, the terms should be understood on the basis of the disclosure throughout the specification. The principles and features of this invention may be employed in varied and numerous embodiments without departing from the scope of the invention.

Furthermore, although the drawings represent exemplary embodiments of the invention, the drawings are not necessarily to scale and certain features may be exaggerated or omitted in order to more clearly illustrate and explain the present invention.

Expressions such as "at least one of", when preceding a list of elements, modify the entire list of elements and do not modify the individual elements of the list.

The present invention will now be described more fully with reference to the accompanying drawings, in which exemplary embodiments of the invention are shown. In the following description, detailed descriptions about well-known functions or structures, which may obscure the main concept of the present invention, will be omitted herein.

When a part may "include" a certain constituent element, unless specified otherwise, it may not be construed to exclude another constituent element but may be construed to further include other constituent elements. The terms such as "portion", "unit", "module", and "block" stated in the specification may signify a unit to process at least one function or operation and the unit may be embodied by hardware, software executed by hardware, or a combination of hardware and software. Also, as a computer software command to embody the present invention, hardware, software executed by hardware, or a combination of hardware and software may be used instead of a programmed processor/controller. Accordingly, the present invention is not limited by a specific combination of hardware and software.

Throughout the present specification, a "target object" may be one of various internal organs or particular parts of a human body or an animal. Also, the target object may be a phantom that signifies a material having a density of a living creature and a volume and other characteristics close to the physical characteristics such as atomic numbers of elements and molecules in portions of the living creature, such as tissues. For example, the phantom may be a water phantom having a spherical shape and properties similar to portions of a human body.

Throughout the present specification, a "scanning space" signifies a space in which a target object is positioned or retained, or a space in which a medical imaging apparatus may apply or receive a predetermined signal to obtain an image signal generated from the target object. For example, for a magnetic resonance imaging (MRI) system including a cylindrical gantry, the inner space of the gantry may be a scanning space of the MRI system. Throughout the present specification, a "user" may be a medical expert such as a medical doctor, a nurse, a clinical pathologist, a medical image expert, or a technologist who repairs medical equipment, but the present invention is not limited thereto.

Throughout the present specification, a "pulse sequence" signifies a sequence of signals that are repeatedly applied in an MRI system. The pulse sequence may include time parameters of a radio frequency (RF) pulse, for example, repetition time (TR) and time to echo (TE). Throughout the present specification, a "pulse sequence schematic" refers to an order of events happening in an MRI system. In other words, a pulse sequence schematic illustrates RF pulses, a gradient magnetic field, and an echo RF signal in a passage of time. Throughout the present specification, a "gradient pulse" signifies signals applied to a gradient coil so that a gradient coil may generate a perturbation in a magnetic field in a scanning space.

Figure 1:
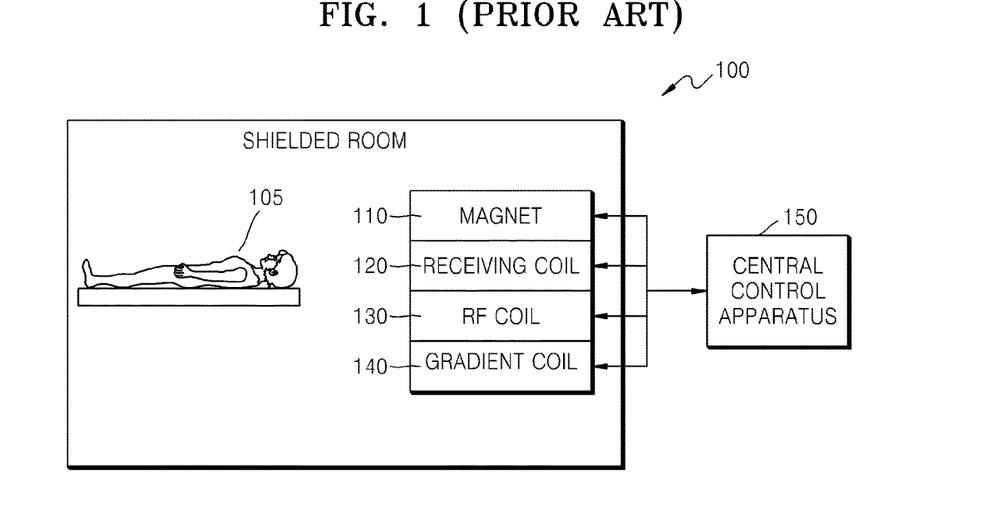
FIG. 1 is a block diagram schematically illustrating a general magnetic resonance imaging (MRI) system in the prior art.

FIG. 1 is a block diagram schematically illustrating a general MRI system of the prior art.

A target object 105 undergoes an examination in a cylindrical gantry and/or on a table in a shielded room which is shielded against an external radio frequency (RF) signal. A main magnetic field is formed in the gantry by a magnet 110 and a gradient magnetic field is formed by a gradient coil 140. When a magnetic field is formed outside the target object 105, atomic nuclei in the target object 105 process about a direction of the magnetic field. A frequency such as a resonant frequency of this precession is proportional to the strength of an external magnetic field according to the Lamor equation. When an RF pulse of the same frequency as the resonant frequency is transmitted toward the atomic nuclei processing at the resonant frequency and the transmission of the RF pulse is stopped, the atomic nuclei externally emit the absorbed RF pulses to be detected by the MRI system 100, and then the MRI system 100 obtains an MR image by using the RF pulse emitted from the atomic nuclei.

An RF coil 130 applies an RF pulse of a resonant frequency to the target object 105 to obtain an MR image. A receiving coil 120 receives an echo signal generated in a particular portion of a patient and transfers a received echo signal to a central control apparatus 150 located in a space separated from the shielded room. The echo signal is finally converted to an MR image through a signal processing process.

The gradient coil 140 includes x-axis, y-axis, and z-axis gradient coils. An MRI system forms a gradient magnetic field by applying an appropriate gradient pulse according to the position and angle of a section of the target object 105 to be scanned. The gradient coil 140 may be classified into a slice selection gradient (GS) coil, a frequency encoding gradient (GF) coil, and a phase encoding gradient (GP) according to a function of the gradient magnetic field. For example, a slice selection gradient magnetic field may be formed by an x-axis gradient coil, or alternatively by a y-axis gradient coil or a z-axis gradient coil in some cases.

The MRI system 100 applies a pulse sequence, designed to scan the target object 105, to the RF coil 130 and the gradient coil 140, and obtains an echo signal of an RF signal generated in a scanning space where the target object 105 is positioned. The signals output from the RF coil 130 and the gradient coil 140 may have errors due to many factors. In the prior art, a method of compensating for an error by tuning the MRI system 100 to each of designed pulse sequences has been used. Thus, as the number of pulse sequences having errors to be compensated for increases, an excessive tuning time is needed.

Figure 2A:
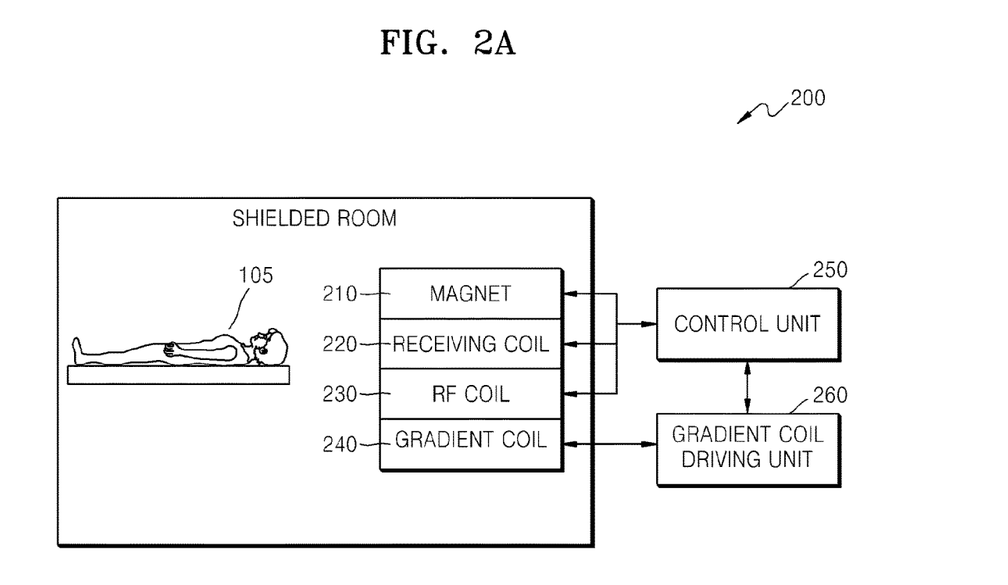
FIGS. 2A and 2B are block diagrams schematically illustrating an MRI system according to an exemplary embodiment of the present invention.
Figure 2B:
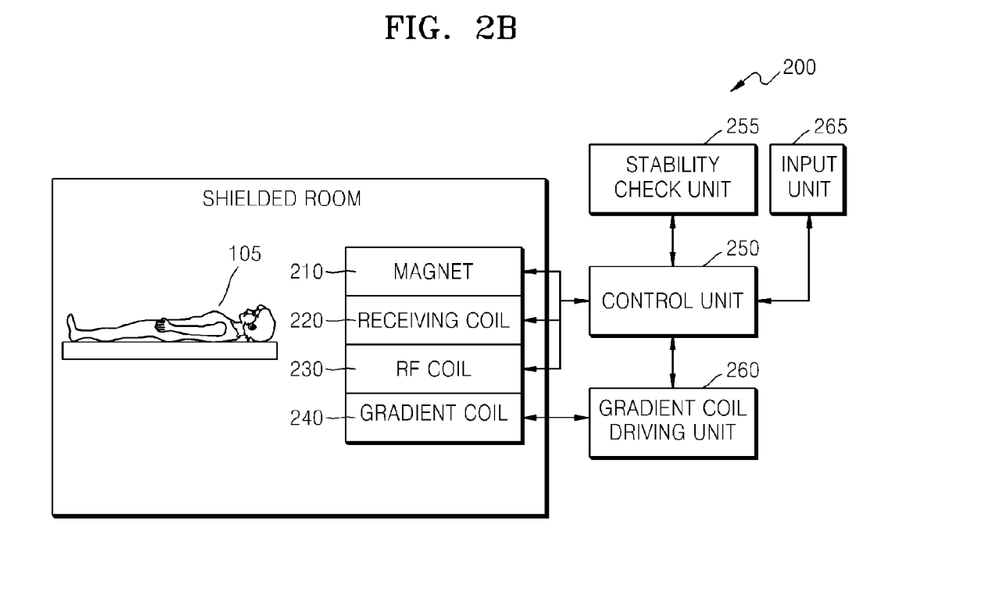
Figure 7:
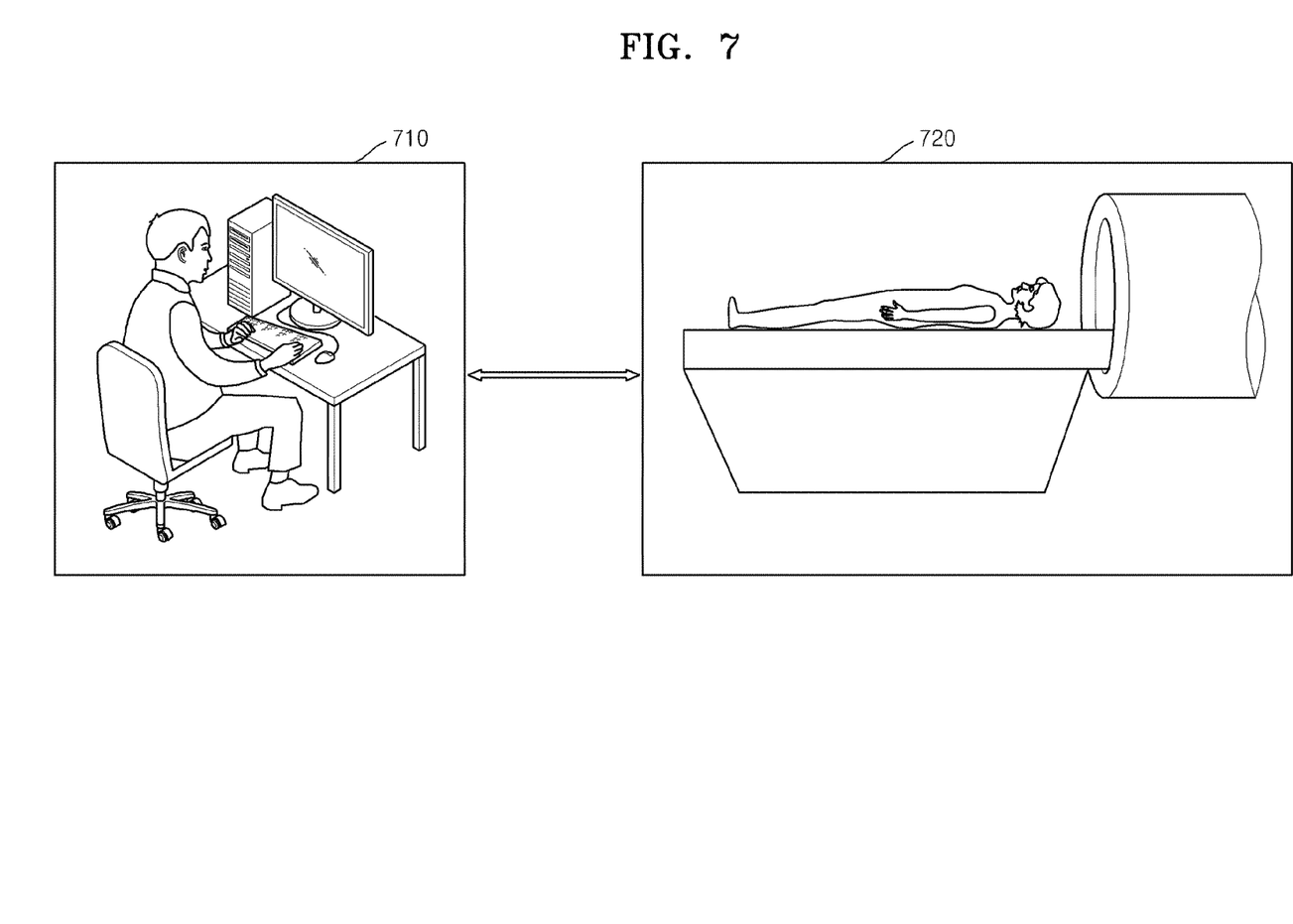
FIG. 7 schematically illustrates an MRI system remotely receiving a user input according to the exemplary embodiment of the present invention.

FIGS. 2A and 2B are block diagrams schematically illustrating an MRI system 200 according to an exemplary embodiment of the present invention. Referring to FIGS. 2A and 2B, the MRI system 200 according to the exemplary embodiment includes a magnet 210, a receiving coil 220, an RF coil 230, and a gradient coil 240 in a shielded room which shields the target object from an external RF signal. The gradient coil 240 includes x-axis, y-axis, and z-axis gradient coils. Also, the MRI system 200 includes a gradient coil driving unit 260 and a control unit 250 outside the shielded room. The gradient coil 240 may further include a stability check unit 255 and an input unit 265 outside the shielded room. Alternatively, at least one of the gradient coil driving unit 260, the stability check unit 255, the input unit 265, and the control unit 250 may be provided in the shielded room. The input unit 265 may be used as a receiving unit for receiving inputs, for example, remotely from a user, as shown in FIG. 7.

The magnet 210 generates or forms a main magnetic field in the scanning space. The gradient coil 240 forms a gradient magnetic field in the scanning space. The RF coil 230 applies an RF pulse to the target object 105 that is positioned in the scanning space where the gradient magnetic field is formed. The receiving coil 220 receives an RF signal generated from the target object 105 to which the RF pulse is applied.

The gradient coil driving unit 260 forms a gradient magnetic field in the scanning space by applying one of a plurality of modified gradient pulses generated based on a predetermined reference gradient pulse to one of an x-axis coil, a y-axis coil, and a z-axis coil of the gradient coil 240. The receiving coil 220 receives a plurality of RF signals generated from the target object 105 in the scanning space where a gradient magnetic field corresponding to the modified gradient pulses is generated or formed.

In conjunction with inputs from a user of the MRI system 200, with the inputs received through the input unit 265 connected to the control unit 250, the control unit 250 controls overall operations of the MRI system 200. For example, the control unit 250 may control the magnet 210, the RF coil 230, the gradient coil 240, the receiving coil 220, and the gradient coil driving unit 260 overall by executing programs stored in a memory included in or connected to the control unit 250. Also, the control unit 250 may obtain an RF signal from the receiving coil 220. The control unit 250 may compensate an output of the gradient coil 240 based on an obtained RF signal, and may generate control signals for controlling the gradient coil driving unit 260 to generate and transmit a modified gradient pulse signal which is used to control the gradient coil 240 to generate a modified gradient magnetic field, as described herein in the present invention.

According to the exemplary embodiment, the control unit 250 may obtain an RF signal from the receiving coil 220 and transmit an obtained RF signal to a stability check unit 255, shown in FIG. 2B, which is connected to the control unit 250. The operation of the stability check unit 255 to determine whether the MRI system 200 is stable is described below with reference to FIGS. 5A-5E and 6.

Figure 3:
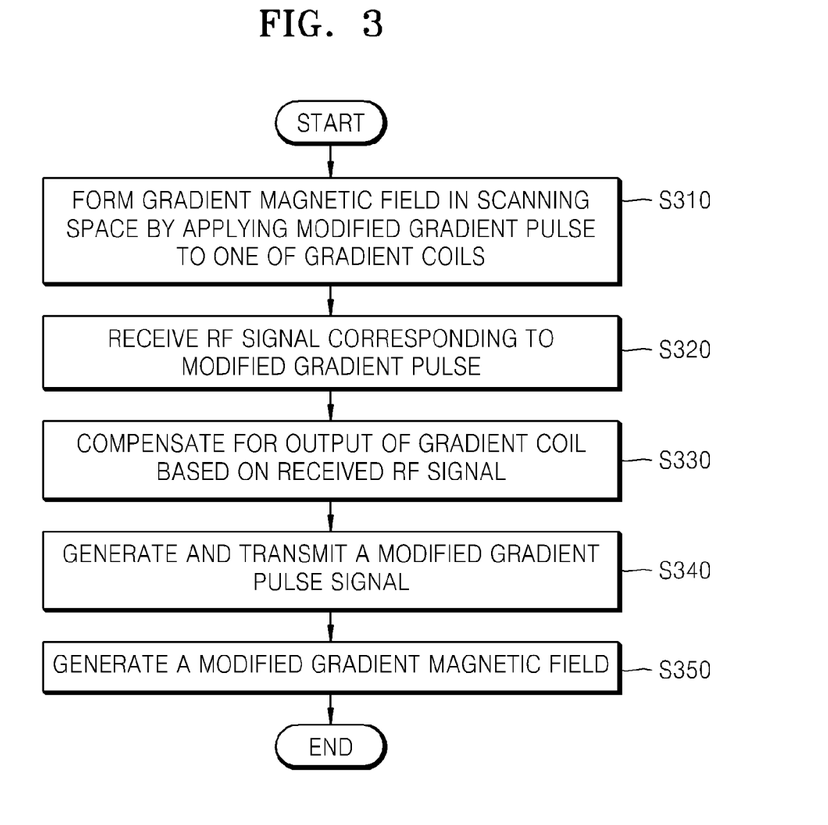
FIG. 3 is a flowchart for illustrating a method of diagnosing an MRI system according to the exemplary embodiment of the present invention.

FIG. 3 is a flowchart for illustrating a method of diagnosing the MRI system 200, including compensating an output of the gradient coil 240, according to the exemplary embodiment of the present invention. Referring to FIG. 3, the MRI system diagnosis method may include operations processed in the MRI system 200 of FIGS. 2A and 2B. The above descriptions of the MRI system 200 of FIGS. 2A and 2B may be applied to the MRI system diagnosis method of FIG. 3.

In step S310, the MRI system 200 applies the modified gradient pulses, generated based on a predetermined reference gradient pulse, to one of the x-axis coil, y-axis coil, and z-axis coil, and thus a gradient magnetic field is formed in the scanning space where the target object 105 is positioned. The reference gradient pulse is a signal applied to the gradient coil 240 to induce an intentional change in a magnetic field in the scanning space and is previously determined to have a constant form regardless of which one of the x-axis coil, y-axis coil, and z-axis coil that the reference gradient pulse is applied to.

According to the exemplary embodiment, the reference gradient pulse used for diagnosis of the MRI system 200 may include a first pulse having a positive (+) value, and a second pulse having a negative (−) value. The first and second pulses may be bipolar pulses having the same amplitude. Also, when an RF pulse applied to the RF coil 230 in a pulse sequence includes a pulse having a phase of 90° and a pulse having a phase of 180°, the reference gradient pulse may be a unipolar pulse including a first pulse having a phase that is earlier than 180° and a second pulse having a phase that is later than 180° and having the same amplitude as that of the first pulse, but the present invention is not limited thereto.

Also, according to the exemplary embodiment, the MRI system 200 may generate the "modified gradient pulses" by modifying the amplitude of the reference gradient pulse. Thus, the modified gradient pulse may include the same pulse as the reference gradient pulse or a pulse having the same shape as that of the reference gradient pulse but having an amplitude larger or smaller than that of the reference gradient pulse. Alternatively, the pulses may be compared according to the intensity of an electric current applied to the gradient coil associated with each pulse.

In addition, according to the exemplary embodiment, the MRI system 200 may generate the modified gradient pulses by modifying at least one of the height, width, and phase of the reference gradient pulse.

In step S320, the MRI system 200 applies an RF pulse to the target object 105 in the scanning space where a gradient magnetic field is formed by the gradient coil 240 in step S310. When the MRI system 200 transmits an RF pulse to the target object 105 and then stops the transmission of the RF pulse, the target object 105 having absorbed the RF pulse generates an RF signal to be emitted externally. The receiving coil 220 receives a plurality of RF signals corresponding to the respective modified gradient pulses applied to the gradient coil 240 in step S310.

In other words, the MRI system 200 forms a gradient magnetic field in the scanning space by applying a predetermined modified gradient pulse, and receives an RF signal corresponding to the modified gradient pulse by applying an RF pulse from the RF coil 230 toward the scanning space where the gradient magnetic field is formed. To obtain a plurality of RF signals, the MRI system 200 changes the gradient magnetic field formed in the scanning space by modifying the applied gradient pulse and repeats the operations of applying an RF pulse toward the scanning space where the gradient magnetic field is changed and receiving an RF signal. The received RF signals may be stored in an internal storage device or an external storage device of the MRI system 200, such as in memory of the control unit 250, or external memory connected to the control unit 250. In step S330, the control unit 250 of the MRI system 200 compensates an output of the gradient coil 240 based on the received RF signals, for example, the control unit 250 generates control signals representing the compensated output. In step S340, in response to the control signals from the control unit 250, the gradient coil driving unit 260 generates and transmits a modified gradient pulse signal to the gradient coil 240, which in turn generates a modified gradient magnetic field in the MRI system 200 in step S350. Step S330 will be described in detail below with reference to FIGS. 4A, 4B, 4C, and 4D.

FIGS. 4A, 4B, 4C, and 4D are views for illustrating a method of compensating for an error included in an output of the gradient coil 240, according to the exemplary embodiment of the present invention.

Figure 4A:
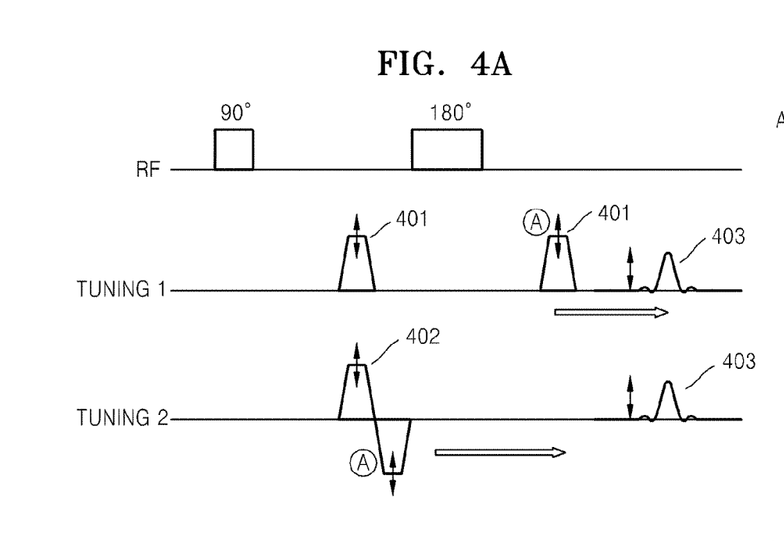
FIGS. 4A, 4B, 4C, and 4D are views for illustrating a method of compensating an output of a gradient coil, according to the exemplary embodiment of the present invention.

Referring to FIG. 4A, the reference gradient pulse used in the present invention may be, for example, a bipolar pulse 402 or a unipolar pulse 401. The MRI system 200 according to the exemplary embodiment may generate a plurality of modified gradient pulses based on the reference gradient pulses 401 and 402. For example, as illustrated in FIG. 4A, modified gradient pulses, represented by the circled "A", are generated by changing the amplitudes of the reference gradient pulses 401 and 402, and the modified gradient pulse, represented by the circled "A", is applied to one of the x-axis coil, the y-axis coil, and the z-axis coil included in the gradient coil 240 so that a gradient magnetic field may be formed in the scanning space.

The MRI system 200 according to the exemplary embodiment repeats the processes of applying an RF pulse to the target object 105 in the scanning space where a gradient magnetic field corresponding to the modified gradient pulse is formed, and of receiving a plurality of RF signals 403. The MRI system 200 obtains tuning information from the received RF signals 403 and compensates for an error included in an output of the gradient coil 240, that is, the outputted gradient magnetic field. According to the exemplary embodiment, the MRI system 200 may alter the reference gradient pulse to receive a predetermined RF signal and use a tuning value obtained by altering the reference gradient pulse as the tuning information for tuning the MRI system 200.

According to the exemplary embodiment, the MRI system 200 may detect an optimal modified gradient pulse for optimizing a received echo signal, that is, an RF signal that is generated from the target object 105 and received from the receiving coil 220. For example, the MRI system 200 may detect, as an optimal modified gradient pulse, a modified gradient pulse when one of the received RF signals, which is located closest to a predetermined phase or has the largest amplitude, is received. Thus, the MRI system 200 may compensate for an output of the gradient coil 240 based on a difference between the optimal modified gradient pulse and the reference gradient pulse. For example, the MRI system 200 may adjust a pulse sequence applied to the gradient coil 240 to compensate the output of the gradient coil 240.

A method of adjusting a pulse sequence may include a method of changing a pulse sequence value stored in a database included in the MRI system 200, with the database stored in a memory of the control unit 250, and storing the changed pulse sequence value instead of the pulse sequence and a method of adjusting a stored pulse sequence value during scanning of or obtaining a medical image and applying the adjusted pulse sequence value to the gradient coil 240. For example, a pulse sequence may include at least one of a spin echo sequence, a turbo spin echo sequence, an inversion recovery sequence, a gradient echo sequence, and a field echo sequence, or other pulse sequences known in the art.

Figure 4B:
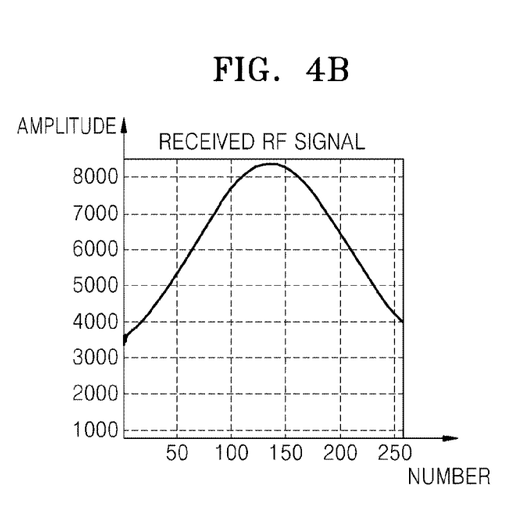
Figure 4C:
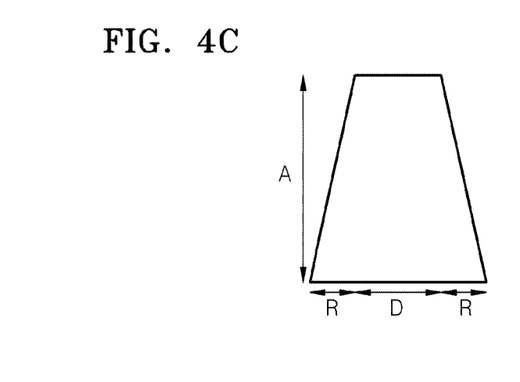
Figure 4D:
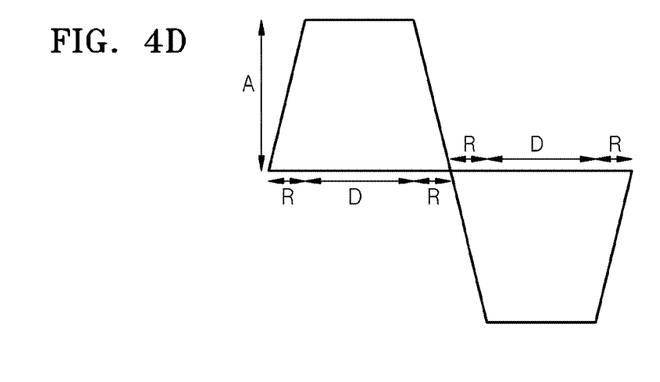

FIG. 4B illustrates data obtained by receiving RF signals corresponding to, for example, 256 modified gradient pulses having different amplitudes. A change in a pulse applied to one of the x-axis coil, the y-axis coil, and the z-axis coil included in the gradient coil 240 may affect the amplitude of an RF signal. The coil that affects the amplitude of an RF signal may be a GS coil or a GP coil. FIG. 4B is a graph showing an RF signal received after a modified gradient pulse is applied to the GS or GP coil of the gradient coil 240 in the MRI system 200. In the graph of FIG. 4B, the x-axis represents the number of received RF signals, and the y-axis illustrates the amplitude of a received RF signal, for example, in Joules (J). For example, the MRI system 200 may regard a modified gradient pulse corresponding to one of the received RF signals having the largest amplitude as an optimal modified gradient pulse, and obtains a difference between the optimal gradient pulse and the reference gradient pulse as tuning information. For example, in FIG. 4B, when the $135^{th}$ received RF signal has the largest amplitude, a difference between a modified gradient pulse corresponding to the $135^{th}$ RF signal and the reference gradient pulse may be used as tuning information to compensate for an error included in an output of the gradient coil 240. As illustrated in FIGS. 4C-4D, the modified gradient pulses used in the present invention may be generated by changing at least one of the height, width, and phase of each of the reference gradient pulses 401 and 402 shown in FIG. 4A, with the modified gradient pulse 401 shown in FIG. 4C, and the modified gradient pulse 402 shown in FIG. 4D. The MRI system 200 may generate the modified gradient pulses 401, 402 by changing at least one of a height A, a ramp time R, a delay time D, and a phase of the reference gradient pulse. The MRI system 200 repeats the processes of applying an RF pulse to the target object 105 in the scanning space where a gradient magnetic field corresponding to a generated modified gradient pulse is formed and receiving the RF signals 403 shown in FIG. 4A. The MRI system 200 may detect an optimal modified gradient pulse that optimizes an RF signal from the received RF signals 403.

The MRI system 200 according to the exemplary embodiment may compensate for an error by applying the tuning information obtained by using the reference gradient pulse to both various pulse sequences and various image processing options; for example, to adjust a pulse sequence using the tuning information or tuning value for applying of the adjusted sequence to the gradient coil 240. For example, according to the exemplary embodiment, MR angiography based image improvement is possible and flow artifacts may be improved by performing error correction using flow compensation technology. Also, accuracy of a velocity encoding gradient magnetic field may be improved in phase contrast MR angiography. Thus the MRI system 200 according to the exemplary embodiment does not need separate tuning of the pulse sequences designed for scanning and obtaining a medical image and thus maintenance and repair of the MRI system 200 may be performed quickly.

According to the exemplary embodiment, the MRI system 200 may determine whether the MRI system 200 is stable by using the reference gradient pulse used for tuning. The MRI system 200 may be configured to compensate an output of the gradient coil 240 only when the MRI system 200 is determined to be stable.

In order to determine whether the MRI system 200 is stable, the reference gradient pulse is applied to at least one of the x-axis coil, the y-axis coil, and the z-axis coil included in the gradient coil 240 to form a gradient magnetic field in the scanning space. The RF coil 230 applies an RF pulse to the target object 105 in the scanning space where the gradient magnetic field is formed. The receiving coil 220 receives an RF signal generated from the target object 105. Accordingly, whether the MRI system 200 is stable may be determined based on at least one of the amplitude and phase of the received RF signal. For example, when the amplitude of the received RF signal is included in a predetermined margin of error, compared to the amplitude of the reference RF signal, the MRI system 200 may be determined to be stable. The reference RF signal may be an RF signal that is expected to be received by the receiving coil 220. The expected RF signal may be determined by calculating the gradient magnetic field formed in the scanning space and an RF pulse applied to the target object 105. The predetermined margin of error may be a range that is experimentally set during manufacturing of the MRI system 200 or by the user while using of the MRI system 200.

Also, according to the exemplary embodiment, the MRI system 200 may calculate stability of the MRI system 200 based on at least one of the amplitude and phase of obtained RF signals by processing a plurality of RF signal data obtained through a repeated operation. For example, a process of obtaining an RF signal from the target object 105, by applying a predetermined gradient pulse to the target object 105 in the scanning space where the gradient magnetic field is formed, is repeated, for example, 200 times or more. When a change in the amplitude of the received RF signals obtained by the repeated operation is within a predetermined range, the MRI system 200 may be determined to be stable, which is a predetermined criteria for determining the stability of the MRI system 200. In contrast, when a change in the amplitude or phase of an RF signal exceeds the predetermined range as a result of processing the obtained RF signal data, the MRI system 200 may be determined to be unstable. When the MRI system 200 is determined to be unstable, a user may determine the reason for the instability and have the MRI system 200 repaired. Also, when the MRI system 200 is determined to be stable, the MRI system 200 may automatically compensate an output of the gradient coil 240 as described above with reference to FIGS. 2-4D, for example, under the control of the control unit 250 and without the need for inputs from the user.

According to the exemplary embodiment, the MRI system 200 may apply an RF pulse to the target object 105 without forming a gradient magnetic field in the scanning space by not applying a pulse to the gradient coil 240. The MRI system 200 may receive a gradient-off RF signal from the target object 105 in the scanning space where no gradient magnetic field is formed and use a received gradient-off RF signal to determine whether the MRI system 200 is stable.

The determination of whether the MRI system 200 is stable will be described in detail below with reference to FIGS. 5A, 5B, 5C, 5D, and 5E.

FIGS. 5A, 5B, 5C, 5D, and 5E are views of pulse sequences used to determine whether the MRI system 200 is stable in the MRI system diagnosis method of FIG. 3. In FIGS. 5A, 5B, 5C, 5D, and 5E, "X", "Y", and "Z" indicate signals applied to the x-axis coil, the y-axis coil, and the z-axis coil, respectively, and "signal" refers to a signal received by the receiving coil 220.

Figure 5A:
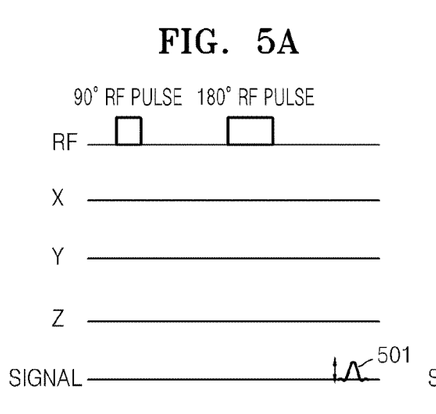
FIGS. 5A, 5B, 5C, 5D, and 5E are views of pulse sequences used to determine whether an MRI system is stable in the MRI system diagnosis method of FIG. 3.

According to the MRI diagnosis method of the exemplary embodiment, as illustrated in FIG. 5A, whether the MRI system 200 is stable may be determined based on an RF signal 501 obtained by applying an RF pulse only to the RF coil 230 when the gradient coil 240 is turned off. For example, the MRI system 200 may be determined to be stable when the amplitude or phase of the obtained RF signal 501 is within a predetermined margin of error compared to a reference RF signal or when a change in the amplitude or phase of the obtained RF signal 501 after repeating the above process multiple times is within a predetermined range. When the MRI system 200 is determined to be stable by using a pulse sequence in FIG. 5A, it may be seen that the operations of parts related to the driving of, for example, the RF coil 230 and the receiving coil 220 in the MRI system 200 are stable. In other words, even when the whole MRI system 200 is unstable, if the RF signal 501 obtained by using the pulse sequence in FIG. 5A is stable, a user may see that the parts related to the driving of the RF coil 230 and the receiving coil 220 are not relevant to the instability of the MRI system 200.

Figure 5B:
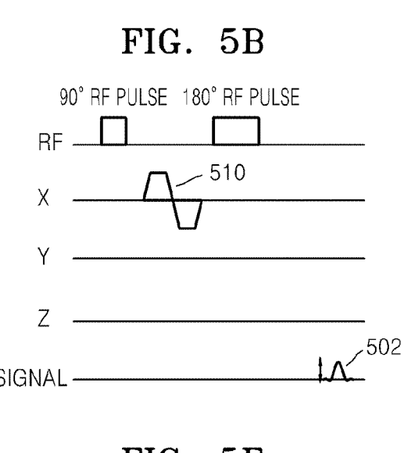
Figure 5C:
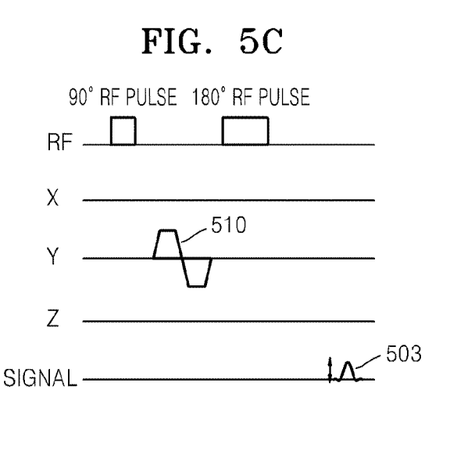
Figure 5D:
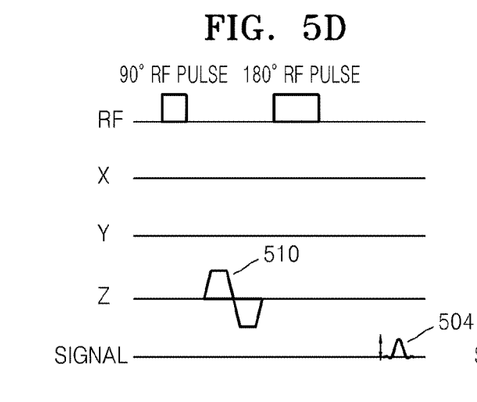

In addition, according to the MRI diagnosis method according to the exemplary embodiment, as illustrated in FIGS. 5B, 5C, and 5D, whether the MRI system 200 is stable may be determined based on RF signals 502, 503, and 504 obtained by applying a predetermined reference gradient pulse 510 to one of the x-axis coil, the y-axis coil, and the z-axis coil included in the gradient coil 240. For example, the MRI system 200 may be determined to be stable when the amplitude or phase of each of the obtained RF signals 502, 503, and 504 is within a predetermined margin of error compared to a reference RF signal or when a change in the amplitude or phase of each of the obtained RF signals 502, 503, and 504 after repeating the above process multiple times is within a predetermined range. When the MRI system 200 is determined to be stable by using pulse sequences in FIGS. 5B, 5C, and 5D, it may be seen that the operation of a part related to the driving of, for example, the gradient coil 240 in the MRI system 200 is stable. In other words, even when the whole MRI system 200 is unstable, if the RF signals 502, 503, and 504 obtained by using the pulse sequences in FIGS. 5B, 5C, and 5D are stable, a user may see that the part related to the driving of the gradient coil 240 is not relevant to the instability of the MRI system 200.

Figure 5E:
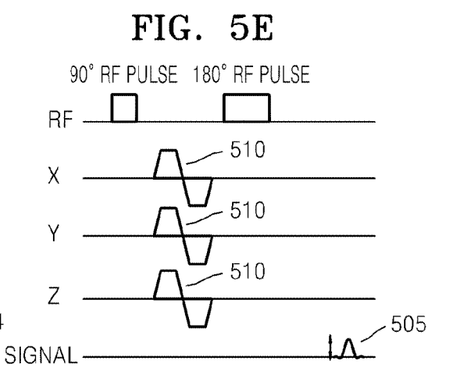

Also, according to the MRI diagnosis method according to the exemplary embodiment, as illustrated in FIG. 5E, whether the MRI system 200 is stable may be determined based on an RF signal 505 obtained by applying the predetermined reference gradient pulse 510 to all of the x-axis coil, the y-axis coil, and the z-axis coil included in the gradient coil 240. For example, after repeating the above process multiple times, the MRI system 200 may be determined to be stable when the amplitude or phase of each of the obtained RF signals 505 from each iteration of the above process is within a predetermined margin of error compared to a reference RF signal or when a change in the amplitude or phase of each of the obtained RF signals 505 from each iteration of the above process is within a predetermined range. When the MRI system 200 is determined to be stable by using the pulse sequences in FIG. 5E, it may be seen that the operation of a part related to the driving of, for example, the gradient coil 240 in the MRI system 200 is stable. In other words, even when the whole MRI system 200 is unstable, if the RF signal 505 obtained by using the pulse sequences in FIG. 5E is stable, a user may see that the part related to the driving of the gradient coil 240 is not relevant to the instability of the MRI system 200.

As illustrated in FIG. 5, the MRI system 200 according to the exemplary embodiment may measure, evaluate, and diagnose the stability of the whole system by using at least one reference gradient pulse. In other words, since the reference gradient pulse for checking the stability of the gradient coil 240 is unified, a stability check process may be simplified and a checking time, that is, the time to diagnose the functionality of the MRI system 200 may be reduced.

Figure 6:
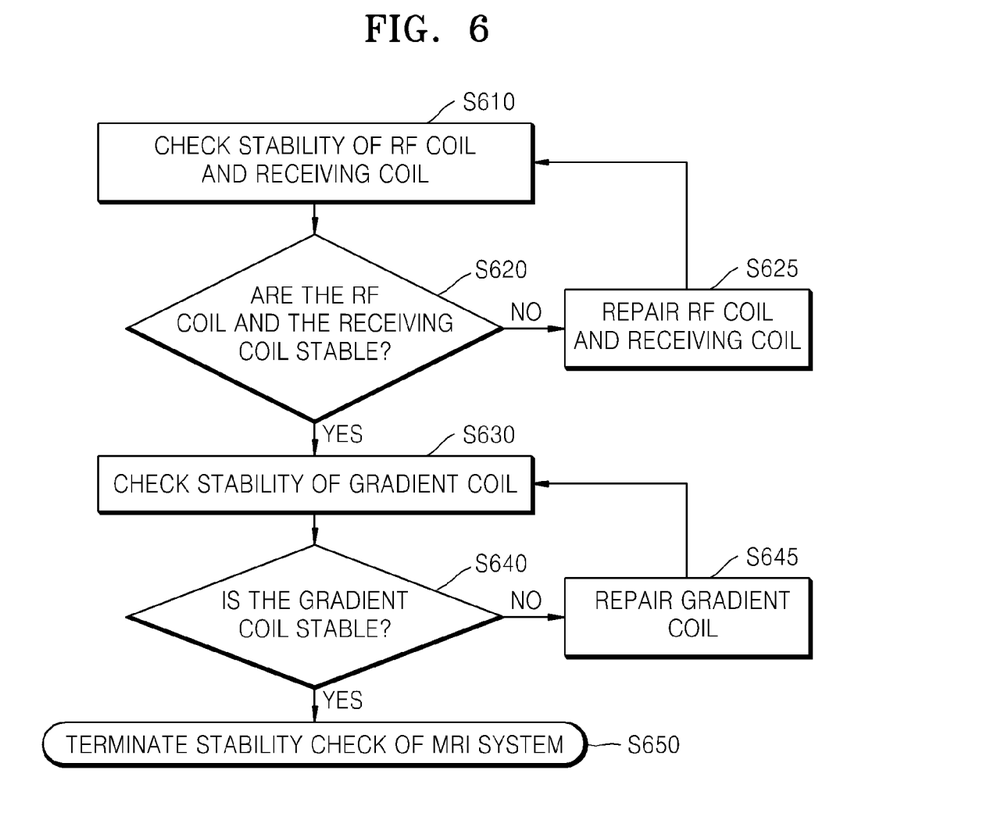
FIG. 6 is a flowchart for illustrating a method of determining whether an MRI system is stable in the MRI system diagnosis method of FIG. 3.

FIG. 6 is a flowchart for illustrating a method of determining whether the MRI system 200 is stable in the MRI system diagnosis method of FIG. 3. The stability check of the MRI system 200 by using any of the pulse sequences shown in FIGS. 5A-5E may be performed in the order shown in FIG. 6.

In step S610, a stability check of the RF coil 230 and the receiving coil 220 may be performed. For example, the pulse sequence of FIG. 5A may be used for the stability check. The MRI system 200 may determine in step S620 whether parts related to the driving of the RF coil 230 and the receiving coil 220 are stable, based on an RF signal generated from the target object 105 in the scanning space where no gradient magnetic field is formed.

If the RF coil 230 and the receiving coil 220 are not stable, as determined in step S620, the MRI system 200 may output information in step S625 indicating that the RF coil 230 and the receiving coil 220 need to be repaired. The information may be output, for example, from a display of the MRI system 200 as shown in FIG. 7 or by other known output devices such as a printer, which may be connected to the control unit 250. To repair the RF coil 230 and the receiving coil 220, a user may, for example, modify software in the MRI system 200 or replace parts corresponding to the RF coil 230 and the receiving coil 220. After step S625, the method loops back to perform steps S610-S620.

If the RF coil 230 and the receiving coil 220 are stable, as determined in step S620, a stability check of the gradient coil 240 may be performed in step S630. The pulse sequences in FIGS. 5B, 5C, 5D, and 5E may be used for the stability check. In other words, the MRI system 200 may determine in step S640 whether the part related to the driving of the gradient coil 240 is stable, based on an RF signal generated from the target object 105 in the scanning space that is formed by applying the predetermined reference gradient pulse 510 to one or all of the x-axis coil, the y-axis coil, and the z-axis coil.

If the gradient coil 240 is not stable, the MRI system 200 may output information in step S645, for example, from a display of the MRI system 200 as shown in FIG. 7 or by other known output devices such as a printer, indicating that the gradient coil 240 needs to be repaired, and the method loops back to perform steps S630-S640. To repair the gradient coil 240, a user may, for example, modify software in the MRI system 200 or replace a part corresponding to the gradient coil 240. The user may determine a reason for the instability of the MRI system 200 according to whether a received RF signal is stable for each case of applying the reference gradient pulse 510 to the x-axis coil, the y-axis coil, the z-axis coil, and all of the x-axis coil, the y-axis coil, and the z-axis coil, as shown in FIGS. 5B-5E, respectively.

For example, the MRI system 200 may perform data processing of the amplitude and phase of an RF signal obtained from the receiving coil 220 and present a total evaluation report to the user, for example, through the display in FIG. 7 or by other known output devices such as a printer, for diagnosing the MRI system 200. A user may recognize problems of the MRI system 200 from the total evaluation report. Also, for example, the user may diagnose the MRI system 200 and recognize problems by comparing the amplitude and phase of an RF signal obtained from the receiving coil 220 with preset values. The "preset values"

may be simulated values or calculated values of an RF signal that is expected to be obtained when a problem occurs in each part of the MRI system 200.

Referring back to step S640, when the parts related to the driving of the RF coil 230, the receiving coil 220, and the gradient coil 240 are all determined to be stable, the MRI system 200 is determined in step S640 to be stable and the stability check is terminated in step S650.

As described above, when the MRI diagnosis method according to the exemplary embodiment is used, the stability of the MRI system 200 may be checked more quickly and simply by using a predetermined test gradient pulse. Thus, since the reason for the instability of the MRI system 200 may be easily determined, the MRI system 200 may be repaired.

The MRI system 200 according to the exemplary embodiment may be used to check the stability of the MRI system 200 used to compensate for an error of an output of the gradient coil 240. For example, the MRI system 200 according to the exemplary embodiment may use the gradient pulse used to compensate for an error of an output of the gradient coil 240 to check the stability of the MRI system 200. For example, the MRI system 200 may compensate the output of the gradient coil 240 by using the reference gradient pulse used for the stability check only when the MRI system 200 is determined to be stable. In compensating for an error included in the output of the gradient coil 240, when the MRI system 200 is stable, the error may be accurately measured and compensated for. However, the MRI system 200 according to the exemplary embodiment may perform the operation of determining whether the MRI system 200 is stable and the operation of compensating of the output of the gradient coil 240 as one operation.

According to the exemplary embodiment, since one gradient pulse is used in the process of checking whether the MRI system 200 is stable and compensating for an error included in the output of the gradient coil 240, the process is simplified and thus a possibility of a user making an error in the diagnosis of the MRI system is greatly reduced. Thus, accuracy in a check result and an error compensation result is greatly improved.

FIG. 7 schematically illustrates an MRI system 720 remotely receiving a user input according to the exemplary embodiment of the present invention. Referring to FIG. 7, the method of diagnosing an MRI system according to the exemplary embodiment may be performed based on a user input that is remotely received. In the exemplary embodiment, since the stability of the MRI system 720 is determined by using a single gradient pulse and an error may be compensated for, the process of diagnosing and repairing the MRI system 720 may be greatly simplified. Thus, the state of the MRI system 720 may be measured, adjusted, evaluated, and diagnosed by a user 710 using a terminal or workstation, which may include a display or other output devices, as well as the input unit 265 shown in FIG. 2B, with the user possibly located remote from the MRI system 720. The input unit 265 and/or the entire terminal or workstation operate at least as a receiving unit to receive inputs from the user, for example, remotely from the MRI system 720. Since these processes are performed remotely through a network, the user 710 does not need to directly visit a place where the MRI system 720 is located, for diagnosis and repair of the MRI system 720, and time and costs may also be saved. To remotely perform the MRI system diagnosis method, the MRI system 720 may further include a receiving unit for remotely receiving a user input through the input unit 265.

Also, the user 710 may store a diagnosis result and an error compensation record of the MRI system 720, for example, in a memory of the terminal or workstation. When a problem later occurs in the MRI system 720, the user 710 may quickly recognize the reasons for the problem by referring to the stored diagnosis result and error compensation record.

As described above, since an error of a gradient coil is measured by using a single test gradient pulse and an output of the gradient coil is compensated, the tuning process of an MRI system is more simple and accurate. As the diagnosis and error compensation of the MRI system are more simply and accurately performed, a user remotely located from the MRI system may analyze a problem and repair the MRI system without having to visit a site where the MRI system is located.

The above-described apparatus and methods according to the present invention can be implemented in hardware or firmware, or as software or computer code, or combinations thereof. In addition, the software or computer code can also be stored in a non-transitory recording medium such as a CD ROM, a RAM, a ROM whether erasable or rewritable or not, a floppy disk, CDs, DVDs, memory chips, a hard disk, a magnetic storage media, an optical recording media, or a magneto-optical disk or computer code downloaded over a network originally stored on a remote recording medium, a computer readable recording medium, or a non-transitory machine readable medium and to be stored on a local recording medium, so that the methods described herein can be rendered in such software, computer code, software modules, software objects, instructions, applications, applets, apps, etc. that is stored on the recording medium using a general purpose computer, a digital computer, or a special processor or in programmable or dedicated hardware, such as an ASIC or FPGA. As would be understood in the art, the computer, the processor, microprocessor controller or the programmable hardware include volatile and/or non-volatile storage and memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, the program may be electronically transferred through any medium such as communication signals transmitted by wire/wireless connections, and their equivalents. The programs and computer readable recording medium can also be distributed in network-coupled computer systems so that the computer readable code is stored and executed in a distributed fashion.

While this invention has been particularly shown and described with reference to exemplary embodiments thereof, it will be understood by those of ordinary skill in the art that various changes in form and details may be made therein without departing from the spirit and scope of the invention as defined by the appended claims.

What is claimed is:

1. A method of operating a magnetic resonance imaging (MRI) system having a gradient coil and a radio frequency (RF) coil, the method comprising:

generating, by the MRI system, a gradient magnetic field in a scanning space where a target object is positioned by generating a plurality of modified gradient pulses based on a reference gradient pulse and applying one of the plurality of modified gradient pulses to one of an x-axis coil, a y-axis coil, and a z-axis coil included in the gradient coil;

applying, by the MRI system, a radio frequency (RF) pulse from the RF coil to the target object in the scanning space where the gradient magnetic field corresponding to each of the plurality of modified gradient pulses is generated, and receiving a plurality of RF signals that are generated from the target object and correspond to the plurality of modified gradient pulses;

compensating, by the MRI system, an output of the gradient coil based on the plurality of received RF signals;

responsive to the compensating, generating and transmitting, by the MRI system, a modified gradient pulse signal to the gradient coil; and generating, by the MRI system, a modified gradient magnetic field by the gradient coil using the modified gradient pulse signal, wherein, in the compensating of the output, the output of the gradient coil is compensated based on a difference between the reference gradient pulse and a modified gradient pulse corresponding to one of the plurality of received RF signals that has a largest amplitude.

2. The method of claim 1, wherein the compensating of the output comprises:

determining a tuning value with respect to the reference gradient pulse by using the plurality of received RF signals; and adjusting a pulse sequence applied to the gradient coil based on the tuning value.

3. The method of claim 1, wherein the compensating of the output comprises detecting an optimal modified gradient pulse for optimizing the RF signal based on the plurality of received RF signals and adjusting a pulse sequence applied to the gradient coil based on a difference between the optimal modified gradient pulse and the reference gradient pulse.

4. The method of claim 3, wherein the pulse sequence comprises at least one of a spin echo sequence, a turbo spin echo sequence, an inversion recovery sequence, a gradient echo sequence, and a field echo sequence.

5. The method of claim 1, wherein the generating of the modified gradient magnetic field comprises generating the plurality of modified gradient pulses by modifying at least one of a height, width, and phase of the reference gradient pulse.

6. The method of claim 1, wherein the reference gradient pulse comprises a first pulse having a positive value and a second pulse having a negative value, and the first and second pulses have same amplitude.

7. The method of claim 1, wherein the RF signal comprises a pulse having a phase of 90° and a pulse having a phase of 180°, and the reference gradient pulse comprises a first pulse having a phase that is earlier than 180° and a second pulse having a phase that is later than 180°, with the first and second pulses having same amplitude.

8. The method of claim 1, further comprising determining whether the MRI system is stable by using the reference gradient pulse; and wherein the generating of the gradient magnetic field, the receiving of the plurality of RF signals, and the compensating of the output of the gradient coil are performed after the determining that the MRI system is stable.

9. The method of claim 8, wherein the determining of whether the MRI system is stable comprises:

generating a gradient magnetic field in the scanning space by applying the reference gradient pulse to at least one of the x-axis coil, the y-axis coil, and the z-axis coil;

repeating a plurality of times the applying of an RF pulse from the RF coil to the target object in the scanning space where the gradient magnetic field is formed and receiving of an RF signal generated from the target object in the scanning space where the gradient magnetic field is formed, the RF signal being received by a receiving coil; and determining that the MRI system is stable when a change in at least one of an amplitude and a phase of the received RF signals is within a predetermined range.

10. The method of claim 1, further comprising:

remotely receiving an input; and performing the generating, applying, and compensating based on the received input.

11. A method of operating a magnetic resonance imaging (MRI) system including a gradient coil, a radio frequency (RF) coil, and a receiving coil, the method comprising:

generating, by the MRI system, a gradient magnetic field in a scanning space where a target object is positioned by applying a predetermined reference gradient pulse to at least one of an x-axis coil, a y-axis coil, and a z-axis coil included in the gradient coil;

repeating, by the MRI system, a plurality of times applying of an RF pulse from the RF coil to the target object in the scanning space where the gradient magnetic field is generated, and receiving of an RF signal generated from the target object, the RF signal being received by the receiving coil;

determining, by the MRI system, whether the MRI system is stable based on a change in at least one of an amplitude and a phase of the received RF signals;

responsive to a determination that the MRI system is not stable, generating and transmitting, by the MRI system, a modified gradient pulse signal to the gradient coil; and generating, by the MRI system, a modified gradient magnetic field by the gradient coil using the modified gradient pulse signal.

12. A magnetic resonance imaging (MRI) system, the MRI system comprising:

a magnet for generating a main magnetic field in a scanning space where a target object is positioned;

a radio frequency (RF) coil for generating an RF signal in the scanning space;

a gradient coil including an x-axis coil, a y-axis coil, and a z-axis coil;

a gradient coil driving unit for generating a gradient magnetic field in the scanning space by applying one of a plurality of modified gradient pulses generated based on a predetermined reference gradient pulse to one of the x-axis coil, the y-axis coil, and the z-axis coil included in the gradient coil;

a receiving coil for receiving a plurality of RF signals that are generated from the target object in the scanning space where a gradient magnetic field is generated and corresponds to the plurality of modified gradient pulses; and a control unit for controlling the magnet, the RF coil, the gradient coil, the gradient coil driving unit, and the receiving coil, wherein the control unit compensates an output of the gradient coil based on the plurality of received RF signals by generating a control signal;

wherein the gradient coil driving unit, responsive to the control signal, generates and transmits a modified gradient pulse signal to the gradient coil;

wherein the gradient coil generates a modified gradient magnetic field using the modified gradient pulse signal; and wherein, in the compensating of the output, the output of the gradient coil is compensated based on a difference between the reference gradient pulse and a modified gradient pulse corresponding to one of the plurality of received RF signals that has a largest amplitude.

13. The MRI system of claim 12, wherein the control unit determines a tuning value with respect to the predetermined reference gradient pulse by using the plurality of received RF signals and adjusts a pulse sequence applied to the gradient coil based on the tuning value.

14. The MRI system of claim 12, wherein the control unit detects an optimal modified gradient pulse for optimizing the RF signal based on the plurality of received RF signals and adjusts a pulse sequence applied to the gradient coil based on a difference between the optimal modified gradient pulse and the predetermined reference gradient pulse.

15. The MRI system of claim 14, wherein the pulse sequence comprises at least one of a spin echo sequence, a turbo spin echo sequence, an inversion recovery sequence, a gradient echo sequence, and a field echo sequence.

16. The MRI system of claim 12, wherein the control unit generates the plurality of modified gradient pulses by modifying at least one of a height, width, and phase of the predetermined reference gradient pulse.

17. The MRI system of claim 12, wherein the control unit compensates the output of the gradient coil based on a difference between the predetermined reference gradient pulse and a modified gradient pulse corresponding to one of the plurality of received RF signals that has a largest amplitude.

18. The MRI system of claim 12, wherein the predetermined reference gradient pulse comprises a first pulse having a positive value and a second pulse having a negative value, and the first and second pulses have same amplitude.

19. The MRI system of claim 12, wherein the RF signal comprises a pulse having a phase of 90° and a pulse having a phase of 180°, and the predetermined reference gradient pulse comprises a first pulse having a phase that is earlier than 180° and a second pulse having a phase that is later than 1800, with the first and second pulses having same amplitude.

20. The MRI system of claim 12, further comprising a stability check unit that determines whether the MRI system is stable by using the predetermined reference gradient pulse and using predetermined stability criteria.

21. The MRI system of claim 20, wherein the gradient coil driving unit generates a gradient magnetic field in the scanning space by applying the predetermined reference gradient pulse to at least one of the x-axis coil, the y-axis coil, and the z-axis coil;

the receiving coil repeatedly receiving, a plurality of times, a plurality of RF signals generated from the target object in the scanning space where the gradient magnetic field is generated; and the stability check unit determines that the MRI system is stable when at least one of an amplitude and a phase of the received RF signals is within a predetermined range as the predetermined stability criteria.

22. The MRI system of claim 20, further comprising a receiving unit that remotely receives an input; and wherein the control unit, responsive to the received input, controls the magnet, the RF coil, the gradient coil, the receiving coil, the gradient pulse driving unit, and the stability check unit.

23. A magnetic resonance imaging (MRI) system, the MRI system comprising:

a magnet for generating a main magnetic field in a scanning space where a target object is positioned;

a radio frequency (RF) coil for generating an RF pulse in the scanning space;

a gradient coil including a x-axis coil, a y-axis coil, and a z-axis coil;

a gradient coil driving unit for generating a gradient magnetic field in the scanning space by applying a predetermined gradient pulse to at least one of the x-axis coil, the y-axis coil, and the z-axis coil included in the gradient coil;

a receiving coil repeatedly for receiving a plurality of times an RF signal that is generated from the target object in the scanning space where a gradient magnetic field is generated;

a stability check unit for determining whether the MRI system is stable based on a change in at least one of an amplitude and a phase of each of the received RF signals; and a control unit for controlling the magnet, the RF coil, the gradient coil, the receiving coil, the gradient coil driving unit, and the stability check unit by generating a control signal, wherein the gradient coil driving unit, responsive to the control signal, generates and transmits a modified gradient pulse signal to the gradient coil; and wherein the gradient coil generates a modified gradient magnetic field using the modified gradient pulse signal.

\* \* \* \* \*